United States Patent
Prystupa et al.

(10) Patent No.: US 12,282,724 B2
(45) Date of Patent: *Apr. 22, 2025

(54) FIELD PROGRAMMABLE ANALOG ARRAY

(71) Applicant: 11886894 Canada Ltd., CentrePort (CA)

(72) Inventors: David Allan Prystupa, Pinawa (CA); John Stephen Pacak, Winnipeg (CA); Peter Condie Nell, Winnipeg (CA)

(73) Assignee: 11886894 Canada Ltd., Winnipeg (CA)

( * ) Notice: Subject to any disclaimer, the term of this patent is extended or adjusted under 35 U.S.C. 154(b) by 0 days.

This patent is subject to a terminal disclaimer.

(21) Appl. No.: 18/538,389

(22) Filed: Dec. 13, 2023

(65) Prior Publication Data

US 2024/0232492 A1  Jul. 11, 2024

Related U.S. Application Data

(63) Continuation of application No. 17/178,551, filed on Feb. 18, 2021, now Pat. No. 11,934,758.

(60) Provisional application No. 62/978,671, filed on Feb. 19, 2020.

(51) Int. Cl.
| | |
|---|---|
| *G06F 30/30* | (2020.01) |
| *G06F 30/347* | (2020.01) |
| *H01F 7/06* | (2006.01) |
| *G01N 21/65* | (2006.01) |

(52) U.S. Cl.
CPC ........... *G06F 30/347* (2020.01); *H01F 7/064* (2013.01); *G01N 21/65* (2013.01)

(58) Field of Classification Search
CPC .......... G06F 30/347; H01F 7/064; H01F 7/20; G01N 21/65; H01Q 3/247
See application file for complete search history.

(56) References Cited

U.S. PATENT DOCUMENTS

| | | | | |
|---|---|---|---|---|
| 4,922,253 A | * | 5/1990 | Nathanson | H01Q 15/002 333/262 |
| 5,541,614 A | * | 7/1996 | Lam | H01Q 11/10 343/754 |
| 6,417,807 B1 | * | 7/2002 | Hsu | H01Q 9/285 343/781 CA |

(Continued)

*Primary Examiner* — Jack Chiang
*Assistant Examiner* — Brandon Bowers
(74) *Attorney, Agent, or Firm* — Adrian D. Battison; Ade & Company Inc.; Ryan W. Dupuis

(57) ABSTRACT

A method for dynamically generating or interacting with an electromagnetic field includes providing a spatial array of conductive segments, a switching device operable on each of the conductive segments to either allow or block transmission of an electrical signal and a control device operable on the switching device. A sequence of the conductive segments are connected to form a conductive path where each segments intersects with at least two different ones of the conductive segments at a node. The switching device operates to connect a selected first one of the conductive segments with a selected second one of the conductive segments to form the sequence according to a logic signal from the control device. Power is supplied to the conductive path to produce an electromagnetic field which depends at least in part on the spatial arrangement of the connected sequence of the conductive segments.

17 Claims, 10 Drawing Sheets

(56) References Cited

U.S. PATENT DOCUMENTS

2012/0306720 A1\* 12/2012 Tamai ...................... H01Q 1/50
                                                           343/893
2018/0323657 A1\* 11/2018 Hannigan ............... H02J 50/23
2019/0109498 A1\*  4/2019 Stingu .................... H03F 3/217

\* cited by examiner

FIELD PROGRAMMABLE ANALOG ARRAY

This application is a continuation of application Ser. No. 17/178,551 filed Feb. 18, 2021 which claims the benefit under 35 USC 119 (e) from Provisional application 62/978, 671 filed Feb. 19, 2020, and related to FIELD PROGRAMMABLE ANALOG ARRAY, the disclosure of which is incorporated herein by reference.

This invention relates to a method for dynamically generating spatially variable conductive paths.

This application is related to the subject matter of Provisional Application Provisional Application 62/978,675 filed on Feb. 19, 2020 and related to MAGNETIC PLATFORM FOR SAMPLE ORIENTATION, together with a non-provisional application, filed on a common date with the present application, claiming priority therefrom, the disclosure of both of which documents is incorporated herein by reference.

This application is related to the subject matter of Provisional Application Provisional Application 62/978,680 filed on Feb. 19, 2020 and related to FIELD PROGRAMMABLE FLUIDIC ARRAY, together with a non-provisional application, filed on a common date with the present application, claiming priority therefrom, the disclosure of both of which documents is incorporated herein by reference.

This application is related to Method and Apparatus for Singulating Particles in a Stream as described in PCT Application PCT/CA2017/050907 published on 1 Feb. 2018 as WO 2018/018155 which corresponds to U.S. application Ser. No. 15/662,794, the disclosures of which are incorporated herein by reference.

This application is related to High efficiency multiplexing as described in PCT Application PCT/CA2018/050599 published on 29 Nov. 2018 as WO 2018/213923 which corresponds to U.S. application Ser. No. 15/987,279, now U.S. Pat. No. 10,585,044 issued Mar. 10, 2020 the disclosures of which are incorporated herein by reference.

This application is related to High resolution multiplexing system as described in PCT Application PCT/CA2019/051625 published on 22 May 2020 as WO 2020/097732 which corresponds to U.S. application Ser. No. 16/683,357, the disclosures of which are incorporated herein by reference.

This application is related to Spatial Modulation Device as described in PCT Application PCT/CA2019/051626 published on 22 May 2020 as WO 2020/097733 which corresponds to U.S. application Ser. No. 16/683,376 filed Nov. 14, 2019, the disclosures of which are incorporated herein by reference.

This application is related to Performing operations on a workpiece using Electromagnetic Forces as described in PCT Application PCT/CA2021/050118 which corresponds to U.S. application Ser. No. 17/166,207 filed Feb. 3, 2021, the disclosures of which are incorporated herein by reference.

The present invention relates to a method to dynamically change the spatial arrangement of a conductive path for the purpose of generating or interacting with electromagnetic fields.

The invention is a platform technology that has many diverse applications that include receiving and transmitting electromagnetic signals, directed particle transport for sorting and fabrication, altering the quantum states of objects, orienting objects, and measuring objects.

BACKGROUND OF THE INVENTION

Magnetic arrays comprised of permanent magnets and electromagnets are known in prior art. The magnets in prior art have a fixed geometry and the possible magnetic fields projected into an active volume are limited to linear combinations of the magnetic field from each fixed geometry magnet. In particular, the axes of fixed magnets determine the direction of possible magnetic fields. An object of the present invention is to provide a device that can generate magnetic fields in arbitrary or selected directions.

Phased array antennae known in prior art operate by coordinating signals to and from an array of possibly thousands of individual fixed geometry antennae to synthesize the effect of a larger directional antenna. The individual antennae are not optimally aligned however. Recent prior art describes optical methods to better align received electromagnetic radiation fixed antennae axes as described by Foo in U.S. Pat. No. 10,211,532. An object of the present invention is to better align antennae and measured electromagnetic radiation without external optics. A further object of the invention is to provide passive optics that reflect, diffract or polarize electromagnetic radiation.

SUMMARY OF THE INVENTION

According to the invention there is provided a method for dynamically generating a conductive path for generating or interacting with an electromagnetic field comprising the steps of
providing a spatial array with a plurality of conductive segments, a switching device operable on each of the conductive segments to either allow or block electrical conduction from said conductive segment to a second conductive segment in the spatial array and a control device operable on the switching device to select which of the conductive segments are conductively linked;
connecting a sequence of the conductive segments to form a conductive path.

In one embodiment a power is applied to said conductive path to produce an electromagnetic field and wherein the electromagnetic field depends at least in part on the spatial arrangement of the connected sequence of the conductive segments in the conductive path.

In another embodiment an electromagnetic field is applied to said conductive path to produce an interaction with said conductive path and wherein the interaction with the electromagnetic field depends at least in part on the spatial arrangement of the connected sequence of the conductive segments in the conductive path.

The invention is therefore based on a method for dynamically generating spatially variable conductive paths.

In accordance with an important feature of the invention which can be used independently with any of the following features, there is provided a spatial array comprising a plurality of conductive segments, a switching device operable on each conductive segment to either allow or block transmission of an electrical signal, a plurality of nodes wherein each conductive segment is electrically connected to at least one node and wherein each node has at least three electrically connected conductive segments, and a control device operable on the switching device to select which conductive segments transmit an electric signal. The switching device may be located anywhere along a conductive segment, including at the terminus in a node.

In accordance with an important feature of the invention which can be used independently with any of the preceding or following features, a control device is provided wherein the control device generates signals that control the state of operating devices integral with and connected with the spatial array. In some embodiments the control signals are electrical. In a preferred embodiment the control signals are transmitted by optical device. This embodiment has the advantage that the electromagnetic fields of optical signals are at much higher frequencies than the electromagnetic fields generated by the conductive segment array and consequently don't interfere. The operating device may be a switch between a first conductive segment and one or more conductive segments wherein the switch provides electrical conduction between said first conductive segment and zero or more selected conductive segments dependent on a logic signal from the control device. The operating device may be a current source wherein the control device generates signals that control the magnitude of current transferred from the current source to a conductive segment of the spatial array. The operating device may be a voltage source wherein the control device generates signals that control the magnitude of voltage transferred to a conductive segment of the spatial array. The operating device may be an amplifier wherein the control device generates signals that control the magnitude of amplification of an electrical signal between a first conductive segment and a second conductive segment. The operating device may be a machine readable storage device wherein the machine readable storage device stores information about the state of at least one other operating device and produces signals that cause the state(s) to be maintained. The operating device may be a sensor wherein the control device generates signals that control measurements.

In accordance with an important optional feature of the invention which can be used independently with any of the preceding or following features, the control device further includes a computation device. The computation device includes a machine readable information storage device and a communication device operable to receive and transmit information to an external computation device. The information may for example be parameters for configuring and operating the spatial array. The information may for example be data from sensors embedded in the spatial array. The information may for example be a stream of data received or transmitted by the spatial array. In some embodiments the computation device is operable to receive as input a desired electromagnetic field at a location within the spatial array or proximate to the spatial array and from the input to select a set of conductive segments within the spatial array together with the magnitude of electrical power to be transmitted by each of the selected conductive segments required to generate the desired electromagnetic field. The computation device then generates signals that cause the selected electric power to flow in the selected conductive segments to generate the desired electromagnetic field. In some embodiments, the computation device further receives information about the electromagnetic field from a sensor at a measured location in or proximate to the spatial array and in response to said information changes the magnitude of electrical power in at least one conductive segment to change the electromagnetic field at the measured location. In some embodiments the electromagnetic field at the measurement location is generated by the spatial array and the measurement is a feedback allowing the computation device to modify the pattern of electrical power within the conductive segments so as to reduce the difference between the measured and desired electromagnetic fields. In some embodiments, the electromagnetic field at the measured location is generated by an external source and the computation device generates signals causing electrical power to flow in selected segments thereby altering the electromagnetic field generated by the external source. For example, the external source may be a magnet of a magnetic resonance instrument and the computation device causes electrical power to flow in selected conductive segments of the spatial array so as to adjust the gradient and homogeneity of the magnetic field within a sample zone of the magnetic resonance instrument. In some magnetic resonance embodiments, the magnetic field generated by the spatial array has a time varying component perpendicular to the magnetic field of the external magnet. The arrangement herein can therefore be used generally in magnetic resonance experiments. This can be carried out on small scale samples such as individual cells allowing for example the results of the experiments to be used in a sorter.

In accordance with an important feature of the invention, there is a high resistance barrier to transmission of electrical current between each pair of conductive paths except at nodes. Within nodes electrical current may pass from a first conductive segment to a second conductive segment unconditionally via a permanent link or conditionally via a switching device in response to a logic signal. As non-limiting examples the switching device can be a solid state relay, a reed switch or a transistor responding to an electrical signal from the control device. For example, the switching device may be a photoconductive device responding to an optical signal from the control device.

In accordance with an important feature of the invention, the spatial array of conductive segments and nodes may be two dimensional or three dimensional.

In accordance with an important optional feature of the invention which can be used independently with any of the above or following features, there is provided at least one node with an amplification device that operates to increase the electrical signal transmitted from a first conductive segment to a selected second conductive segment. This feature may be used for example to compensate for voltage drops at semiconductor switches.

In accordance with an important optional feature of the invention which can be used independently with any of the above or following features, there is provided at least one sensor element operable to measure the electric field at a location proximate to a conductive segment. For example, a suitable MEMS sensor is described in Vittorio Ferrari, Distortion-free probes of electric field, Nature Electronics 1, 10-11 (2018). Other electric field sensors may be used.

In accordance with an important optional feature of the invention which can be used independently with any of the above or following features, there is provided at least one sensor element operable to measure the magnetic field at a location proximate to a conductive segment. For example, a Hall Effect sensor may be used. Other magnetic field sensors may be used.

In accordance with an important optional feature of the invention which can be used independently with any of the above or following features, there is provided at least one node with at least one conductive path connected to a conductive object wherein the conductive object is designed and shaped to alter the electric and or magnetic field proximate to said conductive object. Non limiting examples of the conductive object are a spike that concentrates the electromagnetic field proximate to the tip and a plate that homogenizes the electromagnetic field proximate to the plate surface.

In accordance with an important optional feature of the invention which can be used independently with any of the above or following features, at least some of the space within the spatial array not occupied by nodes or conductive segments is filled with a material with relative magnetic permittivity greater than one. The material can be for example a ferromagnetic material that functions to enhance the magnetic field strength at a location proximate to the material. The material can for example function as a magneto-optical device for changing the path of light in response to a change in the magnetic field generated by the spatial array. The material may for example be magnetized by a field generated by conductive segments and produce a magnetic field that persists when no current flows in the conductive segments. The magnetization may subsequently be canceled or changed by applying a second magnetization field generated by electric current flowing in conductive segments of the spatial array.

In accordance with an important optional feature of the invention which can be used independently with any of the above or following features, at least some of the space within the spatial array not occupied by nodes or conductive segments is filled with a dielectric material. The material can for example change refractive index in response to an electric field generated by the spatial array thereby altering the path of light traversing the spatial array.

In accordance with an important optional feature of the invention which can be used independently with any of the above or following features, at least some of the space within the spatial array not occupied by nodes or conductive segments is filled with a thermally conductive material.

In accordance with an important optional feature of the invention which can be used independently with any of the above or following features, at least a portion of the spatial array of conductive segments and nodes is functionally connected with at least one thermal regulation device wherein the thermal regulation device functions to either raise or lower the temperature of a portion of the spatial array.

In accordance with an important optional feature of the invention which can be used independently with any of the above or following features, at least some of the space within the spatial array not occupied by nodes or conductive segments is occupied by at least one channel containing test materials.

In accordance with an important optional feature of the invention which can be used independently with any of the above or following features, the spatial array includes or is proximate to a channel containing a conductive fluid.

In accordance with an important optional feature of the invention which can be used independently with any of the above or following features, the spatial array includes at least one cathode onto which material is deposited by an electrochemical process.

In accordance with an important optional feature of the invention which can be used independently with any of the above or following features, the spatial array includes at least one anode from which material is removed by an electrochemical process.

In accordance with an important optional feature of the invention which can be used independently with any of the above or following features, at least some of the space within the spatial array not occupied by nodes or conductive segments is occupied by at least one light transmitting path.

In accordance with an important optional feature of the invention which can be used independently with any of the above or following features, at least some of the space within the spatial array not occupied by nodes or conductive segments is occupied by at least one radiation generating device. The radiation generating device may for example be a laser or LED associated with a light transmitting path.

In accordance with an important optional feature of the invention which can be used independently with any of the above or following features, at least some of the space within the spatial array not occupied by nodes or conductive segments is occupied by at least one sensor device. The sensor device may for example be a radiation detection device such as a photodiode of photomultiplier tube associated with a light transmitting path. The sensor device may for example be a temperature measurement device such as a thermocouple. The sensor device may for example be an electromagnetic field sensor. The sensor device may for example be an ionic strength sensor that measures the concentration of charged particles in a region of space within the spatial array not occupied by nodes or conductive segments. The sensor device may for example be a chemical sensor that measures the concentration of a chemical species in a region of space within the spatial array not occupied by nodes or conductive segments.

In accordance with an important optional feature of the invention which can be used independently with any of the above or following features, a node may include a device to amplify an electrical power from a first connected conductive segment and transmit said amplified electrical power to a second conductive segment. This feature is useful to compensate for the cumulative power loss as an electrical signal is transmitted along a sequence of conductive nodes.

In accordance with an important optional feature of the invention which can be used independently with any of the above or following features, a node may include a source of electrical power. For example the node may include a device that generates an electric current and places said current on a connected conductive segment. For example the node may include a device that generates a voltage and places said voltage on a connected conductive segment.

In accordance with an important optional feature of the invention which can be used independently with any of the above or following features, the spatial array includes at least one embedded magnet. The magnet may be a permanent magnet with fixed shape, an electromagnet with fixed shape, or any combination of permanent magnet and electromagnet with fixed shape. The magnets with fixed shaped may for example provide a constant magnetic field that is trimmed by magnetic fields generated by electrical current flowing in the spatial array. The combination of magnetic fields generated by the embedded magnet and magnetic fields generated by electrical current flowing through selected conductive segments in the spatial array may for example be integral to a magnetic resonance device.

In accordance with an important optional feature of the invention which can be used independently with any of the above or following features, there is provided at least one node with an amplification device that operates to increase the electrical signal transmitted from a first conductive segment to a selected second conductive segment. This feature may be used for example to compensate for voltage drops at semiconductor switches.

In an important embodiment that may be used in combination with any of the preceding or following embodiments, at least one conductive path between nodes is a straight line between nodes and the switching device for that conductive path is located along the conductive path. This arrangement minimizes the length and resistance of the conductive path but is limited by the requirement that the conductive path and switching device have similar scale. The switching device may for example be a transistor which by present art (Samsung) can be fabricated on scale of 5 nm. Larger sizes that allow larger current flow may be used.

In an important embodiment that may be used in combination with any of the preceding or following embodiments, the path of least one conductive segment is not the shortest path between the end points of the conductive segment. For example, a conductive segment may be an arc.

In an important embodiment that may be used in combination with any of the preceding or following embodiments, a conductive segment may be comprised of a plurality of portions wherein the direction vector for a first portion type is substantially parallel to vector between a point on the first portion and an electromagnetic field point and a second portion type of a conductive segment may have a direction vector substantially perpendicular to the vector between an electromagnetic field point and a point on the second portion of the conductive segment. For convenience, the first portion type is called a transmission portion and the second portion type is called an active portion. The transmission portion type contributes negligible magnetic flux at the field point whereas the active portion type contributes magnetic flux at the field point. For example, a conductive segment may be U shaped wherein the middle part is an active portion and the ends are transmission portions. This embodiment can be used to maximize the density of active portions proximate to a field point by moving node points and associated circuitry more distant from a field point. For example, the magnitude of a magnetic field produced proximate to a field point is greater if the volume proximate to the field point contains conductive segments rather than switching elements of a node. This approach has the additional benefit of reducing the effect of electromagnetic fields generated by logic signals, switching and amplification circuitry in the connecting nodes.

In an important embodiment that may be used in combination with any of the preceding or following embodiments, electrical power flows through a sequence of conductive segments in series.

In an important embodiment that may be used in combination with any of the preceding or following embodiments, electrical power flows through a sequence of conductive segments in parallel.

In an important embodiment that may be used in combination with any of the preceding or following embodiments, the switching device for a plurality of conductive segments joined at a node is located at the node.

In an important embodiment that may be used in combination with any of the preceding or following embodiments, the switching device at a node comprises a logic input port, an analog input port with at least one conductive input path and an analog output port with a plurality of conductive output paths wherein the switching device receives a logic signal at the logic port and based on the logic signal selects zero or more conductive paths at the output port to connect with each selected conductive path at the input port. In a non-limiting example, the input and output ports may be fabricated with analog multiplexers and analog de-multiplexers.

In an important embodiment that may be used in combination with any of the preceding or following embodiments, at least one node includes a memory device that functions to maintain the logic state of that mode in accordance with the last logic state transmitted to that node by the computation device.

In an important embodiment that may be used in combination with any of the preceding or following embodiments, at least one switching device includes a memory device containing a unique address for the switching device wherein the unique address is compared with an address received from the control device and if the addresses match the switching device changes to a state specified by control device.

In an important embodiment that may be used in combination with any of the preceding or following embodiments, the spatial array of nodes forms a periodic lattice wherein there is a conductive path between each node and its nearest neighbors in each orthogonal direction.

In an important embodiment that may be used in combination with any of the preceding or following embodiments, there is at least one conductive path between two different nodes that are not nearest neighbors. In a non-limiting example, the conductive paths may have a star topology.

In an important embodiment that may be used in combination with any of the preceding or following embodiments, a sequence of conductive segments in the spatial array is connected to produce a conductive path and electric current flows along the path to generate a magnetic field wherein at least part of the magnetic field is either external to the spatial array or passes through a channel within the spatial array.

In an important embodiment that may be used in combination with any of the preceding or following embodiments, a magnetic field generated within the spatial array of the invention is used to change the position or orientation of a magnetic object proximate to the spatial array or within a channel internal to the spatial array.

In an important embodiment that may be used in combination with any of the preceding or following embodiments, a magnetic field generated within the spatial array of the invention is used to change the quantum state of an atom or molecule (Zeeman effect) proximate to the spatial array or within a channel internal to the spatial array.

In an important embodiment that may be used in combination with any of the preceding or following embodiments, a sequence of conductive segments in the spatial array is connected to produce a conductive path wherein a voltage different from the voltage of a reference surface is applied to the conductive path and an electric field is generated between at least part of the conductive path and the reference surface and wherein at least a part of the electric field is either external to the spatial array of nodes or passes through a channel within the spatial array.

In an important embodiment that may be used in combination with any of the preceding or following embodiments, an electric field generated by the spatial array of the invention is used to change the position or orientation of a charged particle proximate to the spatial array or within a channel internal to the spatial array.

In an important embodiment that may be used in combination with any of the preceding or following embodiments, an electric field generated by the spatial array of the invention is used to change the quantum state of an atom or molecule (Stark effect) proximate to the spatial array or within a channel internal to the spatial array.

In an important embodiment that may be used in combination with any of the preceding or following embodiments, a sequence of conductive elements in the spatial array is connected; power is applied to said sequence to produce an electromagnetic field; said electromagnetic field changes at least one optical property of an optical material; and said change in optical material changes the path of light.

In an important embodiment that may be used in combination with any of the preceding or following embodiments, a sequence of conductive segments in the spatial array is connected to produce a conductive path wherein a temporally varying power is applied to the conductive path and the conductive path transmits electromagnetic radiation with a spatial pattern that depends at least in part on the spatial arrangement of nodes in the conductive path. In a non-limiting example, the spatial array of conductive paths can be dynamically configured to form an antenna optimally oriented to transmit in a user specified direction at a user specified frequency. This example is functionally equivalent to physically rotating a fixed antenna to a specified orientation.

In an important embodiment that may be used in combination with any of the preceding or following embodiments, a plurality of temporally varying powers differing in phase are applied to a plurality of conductive paths each comprised of a different sequence of nodes to generate electromagnetic radiation wherein spatial pattern of the electromagnetic radiation depends at least in part on the spatial arrangement of nodes in each conductive path. In a non-limiting example, the spatial array of conductive paths can be configured as an array of directional antennae that are coordinated to function as a phased array radio transmitter that can be optimally configured to transmit in different directions and at different frequencies.

In an important embodiment that may be used in combination with any of the preceding or following embodiments, a sequence of conductive segments in the spatial array is connected to produce a conductive path wherein a spatially and temporally varying electromagnetic field incident on the conductive path and the power generated on the conductive path by the electromagnetic field depends at least in part on the spatial arrangement of nodes in the conductive path. In a non-limiting example, the spatial array of nodes can function as a radio receiver that can be reconfigured to receive in different directions and at different frequencies.

In an important embodiment that may be used in combination with any of the preceding or following embodiments, a plurality of conductive paths is formed in the spatial array wherein each conductive path is comprised of a sequence of conductive segments and wherein the power signal generated on each conductive path by an incident electromagnetic radiation depends at least in part on the spatial arrangement of conductive segments on the conductive path and wherein the power signals from the conductive paths are analyzed to obtain information about the incident electromagnetic radiation. In a non-limiting example, the spatial array of nodes can function as a directional phased array radio receiver that can be reconfigured to optimally receive signals from different directions and at different frequencies.

In an important embodiment that may be used in combination with any of the preceding or following embodiments, a plurality of temporally varying powers differing in phase are applied to a plurality of conductive paths each comprised of a different sequence of conductive segments to generate electromagnetic radiation wherein the spatial pattern of the electromagnetic radiation depends at least in part on the spatial arrangement of conductive segments in each conductive path. In a non-limiting example, the spatial array of conductive paths can function as a phased array radio transmitter that can be reconfigured to transmit in different directions and at different frequencies.

In an important embodiment that may be used in combination with any of the preceding or following embodiments, a plurality of conductive segments are connected to form a conductive path wherein the presence of said conductive path changes the electromagnetic field for at least one time instant at a field point external to the conductive path. For example, a plurality of conductive segments may be connected in a mesh to form a reflective element. The reflective element may be for example a parabolic mirror that focuses electromagnetic radiation. In this example, the focal length and optical axis of the parabolic mirror may be changed dynamically by changing the assembly of connected conductive segments.

In some embodiments, a plurality of conductive paths are formed wherein the spatial arrangement of said plurality of conductive paths functions to change the polarization of electromagnetic radiation incident on said plurality of conductive paths. The plurality of conductive paths may for example be arranged as a wire grid polarizer that transmits a first polarization of electromagnetic radiation and reflects a second polarization of electromagnetic radiation. In this embodiment, the optic axis and polarization direction of the wire polarizer may be changed dynamically by changing the sets of connected conductive segments.

In some embodiments, a plurality of conductive paths is formed wherein the spatial arrangement of said plurality of conductive paths functions to diffract electromagnetic radiation. In this embodiment, diffraction gratings with different periods and optical axes can be generated dynamically by connecting different sets of conductive segments. In this embodiment, the distance between conductive paths is comparable to the wavelength of the radiation to be diffracted. This feature can be used for example to direct microwave radiation in different directions by changing the period and orientation of diffractive paths. This feature can be used for example to generate holograms dynamically.

In some embodiments, a plurality of conductive paths is formed wherein the spatial arrangement of said plurality of conductive paths functions to scatter electromagnetic radiation. In this embodiment, the conductive paths are of comparable scale to the wavelength of electromagnetic radiation to be scattered. For example, a 100 micron conductive segment is much smaller than 1 mm electromagnetic radiation and will not scatter strongly, but five to ten such conductive segments connected will scatter 1 mm radiation strongly. In this example the connected segments form an edge filter. In another example, two or more sets of conductive segments with different scale may be connected to form a band pass filter. Since the sets of connected segments can be changed dynamically, the pass band can be tuned. Dielectric material may be included in the array of conductive segments to alter the Mei scattering characteristics of the array. This feature may be used to dynamically change the radar cross section of panel containing a spatial array of the invention.

In an important embodiment that may be used in combination with any of the preceding or following embodiments, the electromagnetic field produced by at least one conductive segment of the spatial array interacts with a conductive fluid to cause magneto hydrodynamic movement of the fluid. The conductive fluid may for example be blood and conductive segments are activated in a sequence to move a blood cell to a location based upon a measured property of the blood cell. The conductive fluid may for example contain metallic ions for an electrochemical deposition process. That is a stream of ions may be directed to a specific location for deposition by magneto hydrodynamic forces. In some embodiments, there is a plurality of streams of conductive fluids that may be varied spatially and temporally by powering different combinations of conductive segments.

In an important embodiment that may be used in combination with any of the preceding or following embodiments, material is electrochemically added to a location on a substrate proximate to the spatial array wherein the quantity of material added depends at least in part on an electromagnetic field generated by at least one conductive segment of the spatial array. Electromagnetic fields generated by the spatial array may for example spatially regulate the concentration of metal ions proximate to a substrate surface location thereby controlling the number of ions electrochemically deposited at the location.

In an important embodiment that may be used in combination with any of the preceding or following embodiments, material is electrochemically removed from a location on a substrate proximate to the spatial array wherein the quantity of material removed depends at least in part on an electromagnetic field generated by at least one conductive segment of the spatial array. For example, the electromagnetic field generated by a conductive segment may alter the concentration of an etching agent at a location.

In an important embodiment that may be used in combination with any of the preceding or following embodiments, there is a measurement device that measures a parameter of material deposited or removed at location and the electromagnetic field at location is changed at least in part based on a measured parameter. For example the thickness of material deposited at location may be measured with an interferometer and the deposition or removal process is stopped when a desired thickness is reached. For example, the crystal form of a crystal grown by an electrochemical process may be measured by x-ray diffraction and the electromagnetic field is regulated to promote single crystal growth.

In an important embodiment that may be used in combination with any of the preceding or following embodiments, a plurality of cathodes are included in the spatial array and material is electrochemically deposited at each cathode. In some embodiments, a plurality of cathodes is each associated with a different substrate and a plurality of parts is electrochemically formed in parallel. In some embodiments, a plurality of cathodes is each associated with a different location of a part, material is added to each location and subsequently the locations are joined together. In some embodiments, a different material is added to each cathode location. For example, the invention may be used as an electrochemical print head that electrochemically deposits different quantities and types of material at different locations on a substrate.

In an important embodiment that may be used in combination with any of the preceding or following embodiments, the cathode is a mandrel with a pre-formed pattern to be reproduced.

In an important embodiment that may be used in combination with any of the preceding or following embodiments, the template for an electrochemically formed object is the temporal and spatial electromagnetic field formed by the spatial array. An electroformed object of arbitrary shape may be produced with the present invention without the preliminary step of producing a physical mandrel. The electromagnetic field produced by the spatial array provides the template instead.

In an important embodiment that may be used in combination with any of the preceding or following embodiments, there is a plurality of anodes from which material is removed.

In some embodiments the material is deposited at a location determined at least in part by the spatial arrangement of anodes and cathodes wherein the spatial arrangement of anodes and cathodes is determined by connections between at least two conductive segments of the spatial array. The material may for example be a metal such as Cu, Ni, Ag or Au. The channel may for example contain a mandrel upon which a part is electroformed. Alternately the electromagnetic field generated by the spatial array may for example take the place of the mandrel for producing an electroformed part.

DETAILED DESCRIPTION

Figure 1:
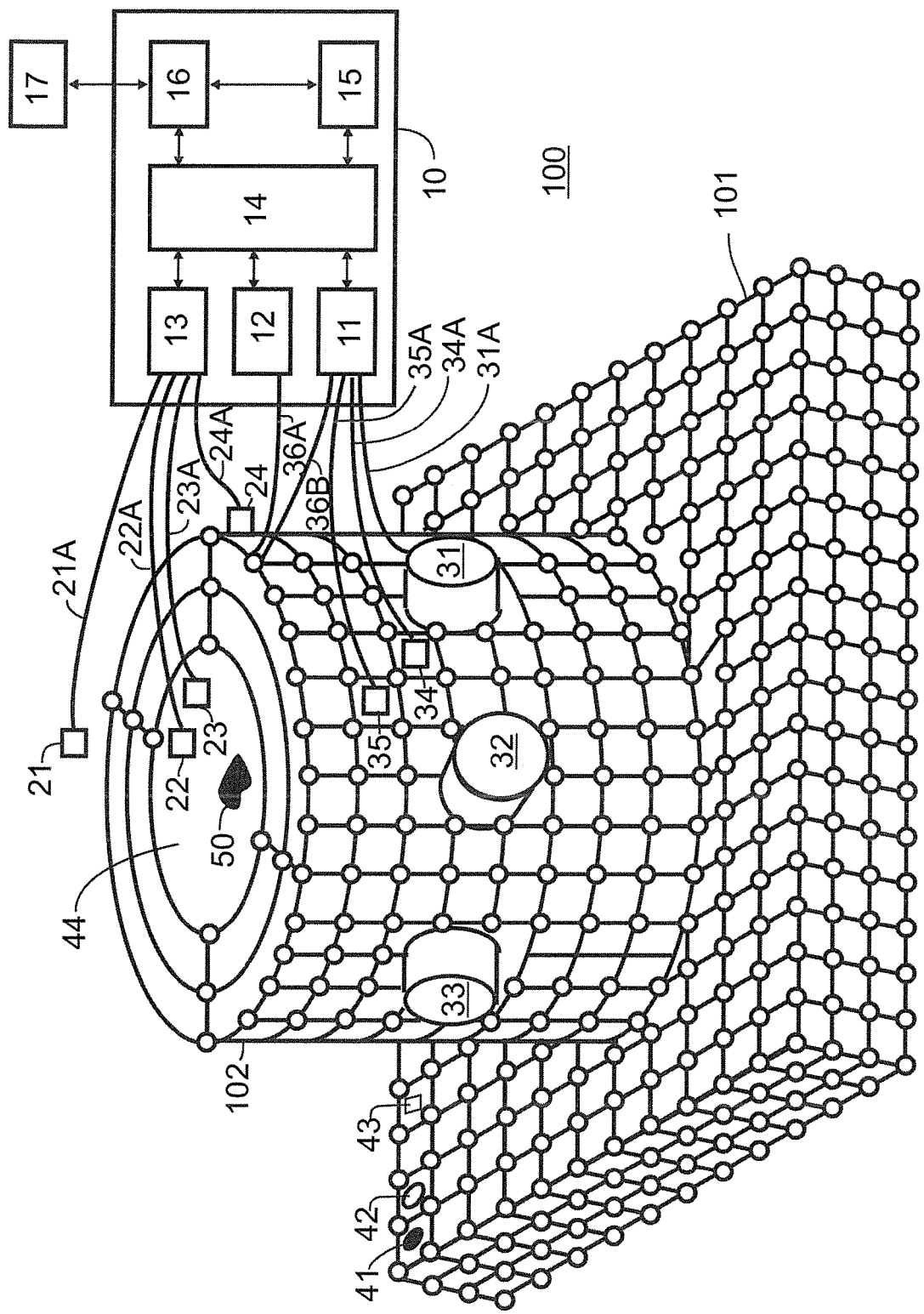
FIG. 1 illustrates an arrangement according to the present invention showing an array of conductive segments connected at nodes.

FIG. 1 shows a general schematic of the invention 100, which includes a spatial array of conductive segments 101 and 102, and a control device 10. The spatial array may include regions with different types of ordering that range from regular to random. For illustrative purposes a region with orthogonal ordering is shown at 101 and a region that has cylindrical ordering is shown at 102. As illustrated the cylindrical region is comprised of three layers in a radial direction, and the orthogonal region is comprised of four layers in the vertical direction for illustrative purposes only. A practical device of the invention may have as few as one layer or more than one million layers in any given direction. Other types of ordering based on space groups, Penrose patterns, fractal geometry and random walks are possible. In general, it is convenient to use a spatial array with the same symmetry characteristics as the electromagnetic fields it is intended to generate or interact with.

The control device 10 comprises a computation device 14 in communication with an analog output port 11, a logical output port 12, an input port 13, a machine readable storage device 15 and a communication device 16. Computation device 14 may for example be a digital processing unit such as a CPU or an FPGA. Computation device 14 may include an analog processing unit. Analog output port 11 functions to distribute electrical power to devices within the spatial array. As illustrated in FIG. 1, the analog output port supplies electrical power to fixed electromagnetic coil 31 via cable 31A. As shown, fixed magnets 31, 32 and 33 are spaced at even intervals around a portion of the spatial array and may be electromagnets, as shown by the connection to power at 31A, permanent magnets, or a combination of permanent and electromagnets. In operation, the fixed magnets function to provide strong magnetic fields and the surrounding spatial array of conductive segments functions to produce magnetic fields that modify or trim the magnetic fields produced by fixed magnets. Analog output 11 is connected by cable 34A to a thermal regulation device shown symbolically at 34 integral to the spatial array. The thermal regulation device in this example may be a thermoelectric (Peltier) cooler or a resistive heater. The spatial array may contain a plurality of thermal regulation devices that function to hold different regions of the spatial array at different temperatures. A radiation source integral to the spatial array is shown symbolically at 35 connected with analog output 11 by cable 35A. The radiation source may for example be a laser, a LED, a thermal blackbody infrared source, a gas discharge tube, an x-ray generator, an ion gun or a microwave generator.

As shown at 36, a node may receive analog power from analog output 11 via cable 36B. The fixed Analog output port 11 may include voltage and current regulation circuits, digital to analog converters, amplifiers, filters, and the like for each output channel. Analog output port 11 may distribute constant electrical power to a first connected device and a time varying waveform to a second connected device. Logical output port 12 functions to transmit logic signals to devices in the spatial array such as nodes and sensors. As shown at 36, a node may receive logic signals via cable 36A from logic output 12. Input port 13 accepts digital and analog signals from sensor devices integral to or proximate to the spatial array. For example radiation sensor 21 may include an analog to digital converter (ADC) and transmit a digital signal to input port 13 by cable 21A or radiation sensor may transmit an analog signal to input port 13 and the analog signal may be converted to a digital format by an ADC integral to the input port. Alternately as discussed in the above cited PCT Application PCT/CA2019/051625, very high speed data analysis of analog waveforms from radiation detector 21 may be carried out with analog circuits. Control device 10 may exchange information with an external device 17 via communication device 16. External device 17 is the interface between the user and the arrangement of the invention. External device 17 may include a computation device, a display device, an input device, a data storage device, a network connection, or any combination thereof.

Computation device 14 takes as input desired electromagnetic fields in a set of regions within or proximate to the spatial array and outputs a set of selected conductive segments and electrical power values (which may be zero) associated with each selected conductive segment that produces the closest approximation to the set of desired electromagnetic fields. The desired electromagnetic fields may be actively generated by the spatial array by applying power to at least one conductive segment and/or passively generated by forming a conductive path between at least two conductive segments that interact with an externally applied electromagnetic field. The computation device models electromagnetic fields produced by the spatial array based on the geometry and electrical properties of materials comprising the spatial array including nodes, conductive segments, logic signal lines, and surrounding materials and voids. It should be noted that the properties of electronic components in nodes together with electromagnetic fields produced by logic signals to nodes are explicitly included in the model.

That is the computation device calculates the electromagnetic fields generated by logic signals supplied to nodes within the spatial array and adjusts the electrical power supplied to conductive segments to compensate for this effect. Once the geometry and material properties are specified, the electromagnetic fields can be calculated by solving Maxwell's equations. For example Maxwell's equations may be approximated as a system of linear equations applied over sufficiently small volume elements and the system of linear equations can be solved by standard matrix algebra. In another example, Maxwell's equations may be solved iteratively over a grid. In another example, Maxwell's equations can be solved with a neural network. Any method that solves Maxwell's equations may be used. The method used to solve Maxwell's equations is not part of the invention.

Optionally the spatial array includes electric field sensor 22 in communication with control device 10 by cable 22A. Optionally the spatial array includes magnetic field sensor 23 in communication with control device 10 by cable 23A. The computation device may use information from electric and magnetic field sensors embedded in the spatial array or proximate to improve its model of electromagnetic fields generated for given sets of connections and power levels among conductive segments. For example, the dimensions of a manufactured spatial array may differ from an ideal specification and consequently the calculated electromagnetic fields differ from measured electromagnetic fields. Optionally the spatial array includes temperature sensor 24 in communication with control device by cable 24A. For example, the material properties may vary with temperature and environmental factors such as humidity. For example, the material properties may change over time due to atomic diffusion or chemical reactions such as oxidation. The computation device 14 may use sensor measurements to improve its model and thereby reduce the difference between a desired electromagnetic and the measured electromagnetic field at each time instant.

The spatial array may include a ferromagnetic material occupying a portion of the volume between conductive segments of the spatial array as indicated schematically at 41. The ferromagnetic material functions to modify the magnetic field proximate to the ferromagnetic material. The spatial array may include dielectric material occupying a portion of the volume between conductive segments of the spatial array as indicated at 42. The dielectric material functions to modify the electric field proximate to the dielectric material. The spatial array may include optical pathways occupying a portion of the volume between conductive segments of the spatial array as indicated at 43. The optical pathways may for example be voids filled with a gas or fiber optics. The spatial array may include channels occupying a portion of the volume between conductive segments of the spatial array as indicated at 44. The channels 44 may include a test material 50 that is acted upon by electromagnetic fields generated by or modified by the spatial array. One or more of the plurality of channels 44 may have a ferromagnetic or dielectric liquid injected or removed at different times to modify the electromagnetic field proximate to that channel.

The spatial array may include a plurality of channels 44. The plurality of channels 44 may for example form an array of similar channels for processing sample objects such as cells in parallel. The plurality of channels 44 may for example form a network wherein the path taken by a test object in the network is regulated by electromagnetic fields generated by the spatial array. The network of channels may include for example gates that regulate flow of a gas or liquid within a channel in response to changes in the electromagnetic field generated at the gate location by the spatial array. A gate object may for example be moved from a first location to a second location by electromagnetic forces generated by the spatial array.

In application, the desired electromagnetic field at a set of locations may be specified directly by a user or the set of desired electromagnetic fields may be generated by another process as those required to have a desired effect on a material within or proximate to the spatial array. For example, as discussed in the above cited PCT Application PCT/CA2021/050118 by the present inventors, the required forces on a magnetic object are determined by a dynamical calculation and the required electromagnetic fields are calculated from the required forces and properties of the magnetic object.

Figure 2:
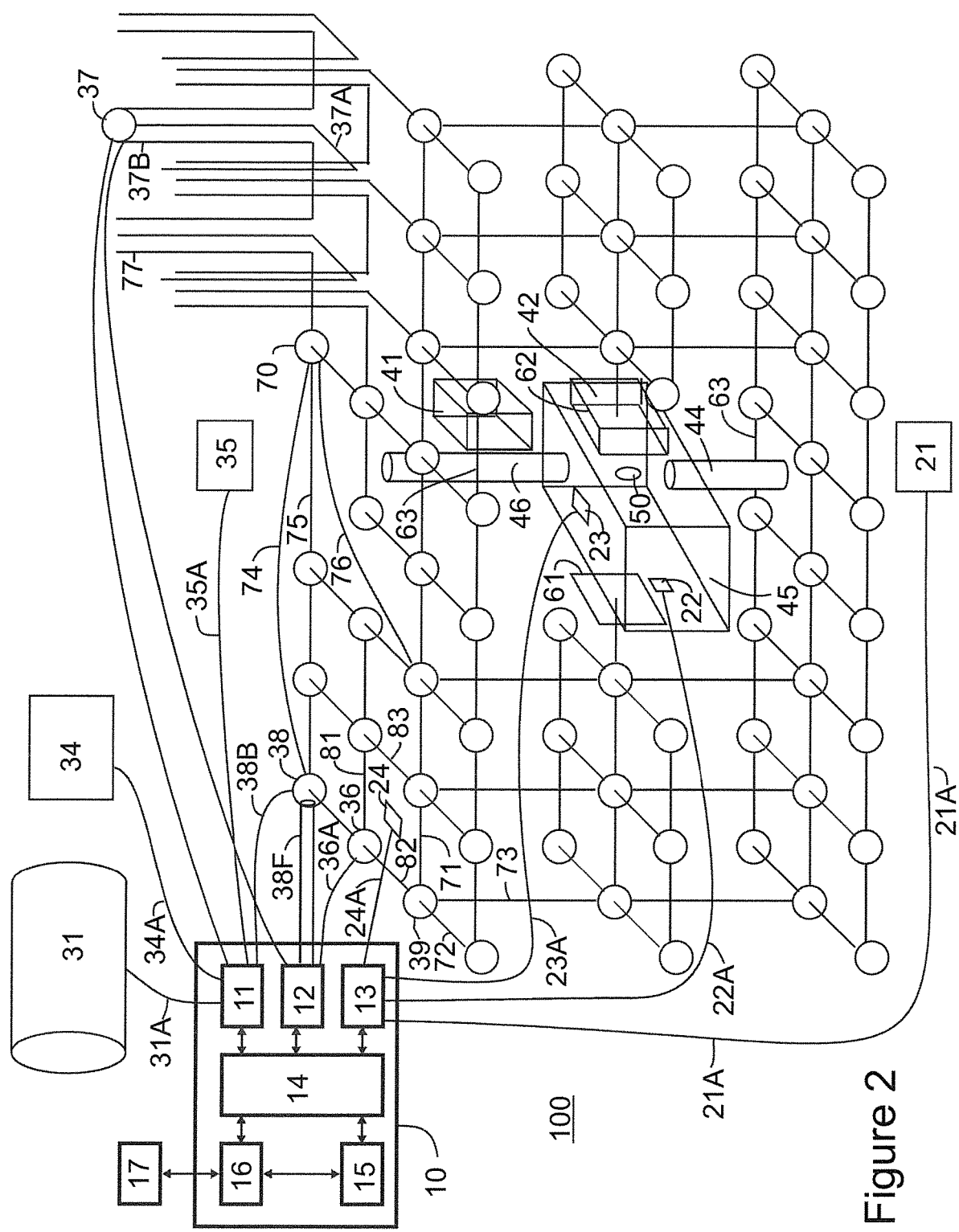
FIG. 2 illustrates the arrangement of FIG. 1 showing an expanded view of an array of conductive segments connected at nodes.

FIG. 2 shows an expanded view of the spatial array of FIG. 1. A general node point 36 may receive logic signals from logic port 12 of control device by cable 36A and dependent on the logic signal form or not form electrical connections between conductive segments connected to node 36. The general node 36 may optionally include device to store state information and maintain state as well as source, sink and amplify electrical power. In another embodiment a general node 38 receives logic signals from logic port 12 of control device 10 by optical fiber 38F. General node 38 also receives electrical power from analog output port 11 of control device 10 by cable 38B. It should be noted that exemplary cable 38B may include a plurality of wires wherein some of the wires may provide a constant power and some of the wires may provide a time varying power. A constant power wire may for example provide power to a transistor gate in node 38 and said gate passes a time varying power from cable 38B along a conductive segment dependent on a logic signal from optical fiber 38F. A constant power wire may for example provide power to a photoconductive gate in node 38 and said gate passes a time varying power from cable 38B along a conductive segment dependent on an analog signal from optical fiber 38F. Optical fibers may be used in general to reduce the effect of electromagnetic fields generated by logic signals on the desired electromagnetic field generated by the spatial array.

Some conductive paths may be generally U shaped including an active region as indicated at 37A and a transport region as indicated at 37B leading to a node 37 at the periphery of the spatial array. The active region 37A generates a magnetic field used within the spatial array when current flows. The transport region 37B is perpendicular to the plane of nodes in the spatial array and hence does not generate a magnetic field component into the array. This arrangement allows switching components to be located at the periphery of a spatial array allowing a higher density of current carrying (and magnetic field generating) conductive segment to be located in the core region of a spatial array.

The spatial array 100 may include light transmitting channels termed "light pipe" as indicated at 44 and 46. The light pipes may for example be a region in the spatial array filled with air. The light pipes may for example include a reflective material around a portion of the periphery of the light pipe. The light pipe may for example be a fiber optic. The spatial array may further include channels containing a gas or fluid as well as objects conveyed by said gas or liquid as indicated at 45. The channel 45 may for example be a micro-fluidic channel containing a biological fluid such as blood conveying objects such as red blood cells as indicated at 50. In this example a radiation source indicated at 35 is connected with analog output port 11 of control device 10 via cable as indicated at 35A. Radiation source 35 may for example be a laser that emits monochromatic radiation into light pipe 46. Light pipe 46 transmits the monochromatic radiation to micro-fluidic channel 45 where the monochromatic radiation is Raman scattered by red blood cell 50. Raman scattered radiation is received by light pipe 44 and transmitted to detector 21 in communication with input port 13 of control device via cable 21A. Detector 21 measures the Raman intensity at a plurality of wavelengths and the intensity pattern is analyzed by computation device 14 to provide information about red blood cell 50. Optionally an electric field may be generated in the region of red blood cell 50 by applying a voltage between conductive plates indicated at 61 and 62. The electric field may be modified by the presence of dielectric material as indicated at 42 and the modified electric field is measured by electric field sensor 22 in communication with input port 13 of control device 10 via cable 22A. The electric field lifts degeneracy of quantum states and thereby alters the measured Raman spectrum. Optionally a magnetic field may be generated by electric current flowing along one or more conductive segments of the spatial array, for example conductive segment 63. The magnetic field generated by current in conductive segment may be modified by the presence of ferromagnetic material in the spatial array as indicated by the block of material at 41 and the modified magnetic field is measured by Hall sensor 23 in communication with input port 13 of control device 10 via cable 23A. The magnetic field lifts degeneracy of quantum states and thereby alters the measured Raman spectrum. In some embodiments, a sequence of electromagnetic fields is generated by the spatial array within a portion of a light pipe producing a sequence of different refractive indices within said light pipe portion. This feature may be used to change the refraction of each wavelength of radiation passing through the light pipe. That is the spatial array may operate as a spectral analyzer. In another embodiment (not shown) the radiation source may be radioactive with no requirement for an electrical supply. The radiation source may simply illuminate the object for observation or the radiation source may function to generate a net electric charge on a portion of the object 50.

The spatial array 100 may include one or more thermal regulation devices as indicated at 34 linked with control device 10 by wire 34A. The thermal regulation device is operable to raise or lower the temperature of different regions of the spatial array. The thermal regulation device may for example be a Peltier device that lowers the temperature of a sample material in sample channel 45. The thermal regulation device may be a heat pipe that conducts heat generated by electric current flowing in conductive segments of the spatial array to an external heat sink. The thermal regulation device may be a resistor that generates heat when current flows and said heat alters the electrical or optical properties of a material in the spatial array 100.

The spatial array 100 may include one or more fixed magnets as indicated at 31 in communication with control 10 by cable 31A. The fixed magnet may be a permanent magnet, an electromagnet, or a combination. For example in operation fixed magnet 31 may provide a static magnetic field and the conductive segments of the spatial array are powered or not powered to modify the spatial distribution of the static field at a location and to provide magnetic field components in directions not provided by the static field. The combined magnetic field may for example be used for magnetic resonance measurements. It should be noted that the conductive segments of the spatial array will typically have much lower inductance than the fixed magnet and consequently the magnetic fields generated by the conductive segments may be switched faster.

The spatial array of conductive segments may be arranged in a periodic lattice with node points 39 connected by conductive segments aligned with lattice vectors. As drawn for illustrative purposes, the lattice is tetragonal, with the lattice vectors a and b along conductive segments 71 and 72 and the c axis along conductive segment 73. The only constraint on the arrangement of conductive segments is that for each conductive segment entering a node, there are at least two conductive paths leaving the node. Spatial arrays, or parts thereof based on a crystallographic space group provide embodiments that maximize the density of nodes, and hence spatial resolution of electromagnetic fields generated. Other spatial arrangements are possible, for example nodes may have a hub and spoke topology as shown by general node 70 linked with conductive segments 74, 75, 76 and 77. Conductive segment 74 has a curved path connecting directly with node 38 four lattice constants distant. Including conductive segments along direct paths between widely spaced nodes minimizes electrical power losses. Node 38 then connects with nearest neighbor nodes to provide local distribution of power from distant node 70. Conductive segment 75 connects with a node two lattice constants distant illustrating a spatial array region with a vacancy. Conductive segment 76 illustrates a spatial arrangement useful for generating an axial electromagnetic field. As illustrated conductive segment 76 is a 90 degree arc between nodes at a constant radius from light pipe 46 and would hence be useful to generate an axial electromagnetic field at light pipe 46. A hub node 70 within the spatial array may be connected to an external connection to the spatial array as illustrated at 77.

The electrical current flow through each node point 36 is logically controlled by control device 10 as indicated by cable at 36A. Control device 10 causes electrical current to flow in loops comprised of different sets of wire segments as indicated at 71, 81, 82 and 83 to generate magnetic fields superimposed on magnetic fields generated by fixed coils 31. The current supplied by analog output 11 is operable on instruction from the computation device 14 to change the magnitude and direction of current supplied to each conductive segment and hence to change the magnitude and direction of the magnetic field generated by each conductive segment. The regions between wire segments 71, 81, 82 and 83 or within coils 31 may contain a material with high magnetic permittivity such as iron to increase the magnetic flux density as shown at 41.

Figure 3:
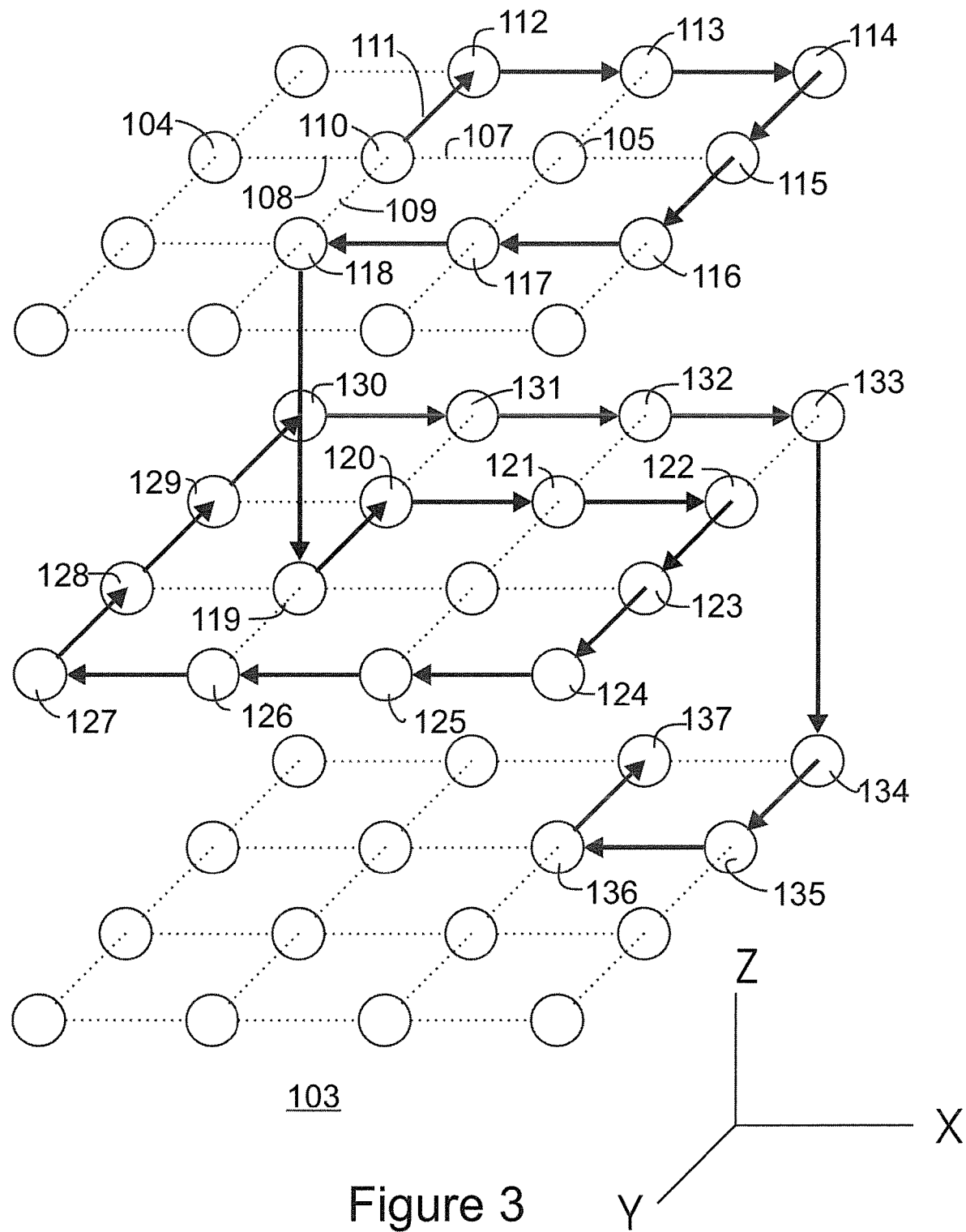
FIG. 3 illustrates the arrangement of FIG. 1 showing a sequence of conductive segments connected at nodes.

FIG. 3 shows a region of the spatial array generally indicated as 103 configured to generate a magnetic field. Each node indicated by a circle as at 104 is connected with logic output 12 of control device 10 (not shown). Control device 10 receives a desired magnetic field specification at a plurality of locations from external device 17 through communication port 16 and computation device 14 produces a plurality of models comprising electric current levels in conductive segments proximate to the locations the specified magnetic field is to be produced. The computation device may for example calculate the magnetic field produced by each conductive segment at the locations by the Biot Savart Law and sum the magnetic field over all conductive segments. The current in some conductive segments may be zero. Computation device 14 chooses the model that best meets selection criteria. The selection criteria may for example be to select the model that minimizes power consumption subject to deviation between the specified magnetic field and calculated magnetic field being smaller than a threshold value. The selection criteria may for example be to select the model that minimizes the difference between the specified magnetic field strength at the locations and the calculated magnetic field strengths. Computation device 14 causes logic port 12 to output logic signals to nodes connected with the sequence of conductive segments specified by the selected model. Computation device 14 causes analog output port 11 to supply calculated power levels to nodes specified by the selected model. Computation device may receive feedback information from magnetic field sensors within the spatial array proximate to the specified locations through input port 13 and based on said feedback information adjust the model parameters to better meet the selection criteria.

Node 110 is connected with analog output port 11 and logic output port 12 of control device 10 by cables (not shown). Node 110 includes switches that optionally connect node 110 with nodes 104, 105, 112 and 118 via conductive segments 108, 107, 111, and 109, respectively. Node 110 receives a logic signal from logic output 12 to form a conductive path between power from analog output 11 and node 112 via conductive segment 111 and sets an internal switch to make the electrical connection. Node 110 includes a logic storage device to store the logic state "connect to node 112" and maintain this state until a different logic signal is received from control device 10. In this logic state, an internal switch in node 110 connecting node 110 to node 112 via conductive segment 111 is closed. In this logic state, an internal switch in node 110 connecting node 110 to node 104 via conductive segment 108 is open. In this logic state, an internal switch in node 110 connecting node 110 to node 105 via conductive segment 107 is open. In this logic state, an internal switch in node 110 connecting node 110 to node 118 via conductive segment 109 is open. In this state electric power flows along conductive segment 111 to node 112 in the direction of the heavy line terminated with an arrow in the direction of power flow. Electric power does not flow along conductive segments such as 107, 108, or 109 shown as dashed lines. The electric current associated with the power flow along conductive segment 111 is in the −Y direction and produces a magnetic field with components in the Z and X directions. Node 112 receives a logic signal specifying that electric power from node 110 is to be directed toward node 113 causing node 112 to close internal switches for conductive segments to nodes 110 and 113 and to open switches to all other conductive segments connected to node 112. Electric current flowing from node 112 to node 113 flows in the X direction and produces a magnetic field with components in the Y and Z directions. In a similar fashion, electric current flows from node 113 to nodes 114, 115, 116, 117 and 118 in a first XY plane. The shape of the connected conductive segments in the first plane is a loop with a length of two segments in each direction.

In some embodiments, the switches are reed switches with minimal voltage drop across the switch. In some embodiments, the switches are photoconductive. In other embodiments, the switches are transistors with a small, but cumulative voltage drop across each switch. In this case some of the nodes along a path of connected conductive segments may contain an amplifier that functions to increase voltage enough to offset voltage drops in preceding or following switches. The amplification factor at each node may be specified by a logic signal from control device 10 and retained by the node until a different amplification value is received. Nodes that contain an amplifier will necessarily also contain a device to receive power. The device to receive power may be a direct connection to analog output port 11. The device to receive power may be a photodiode associated with an optical channel. This option minimizes perturbation of the electromagnetic field due to power flowing in a wire. In some embodiments requiring a slowly changing magnetic field, power may be transmitted to a node by a rapidly changing magnetic field.

Electric power from node 118 flows in the negative Z direction to node 119 and through nodes 120, 121, 122, 123, 124, 125, 126, 127, 128, 129, 130, 131, 132 and 133 in succession within a second XY plane. The shape of the conductive path is generally a spiral with two layers, which emulates a wire winding with a plurality of layers. The center of the spiral in the second layer is different from the center of the loop in the first layer illustrating an important feature of the invention. Specifically, the axis of the magnetic field produced by loops in successive layers can be changed electronically by changing the sequence of connected conductive segments. In contrast prior art fixed coils would require a mechanical reorientation of the coil axis to achieve the same effect.

Electric power from node 133 flows in the negative Z direction to node 134 and through nodes 135, 136, and 137 in succession within a third XY plane. Node 137 may be electrically connected with a ground plane within the spatial array or to a ground plane in control device 10 via a cable from analog output 11 to node 137. The loop formed by the sequence of connected conductive segments in the third XY plane has a center different from the centers of the first and second XY planes. Another important feature illustrated by the offset centers is that the center of the magnetic field may be translated in any direction perpendicular to a fixed orientation by changing the sequence of connected conductive segments. That is the center of the magnetic field can be moved in increments smaller than the spacing between nodes. In prior art fixed coils the same feature would require mechanical translation of the fixed coil.

Figure 4:
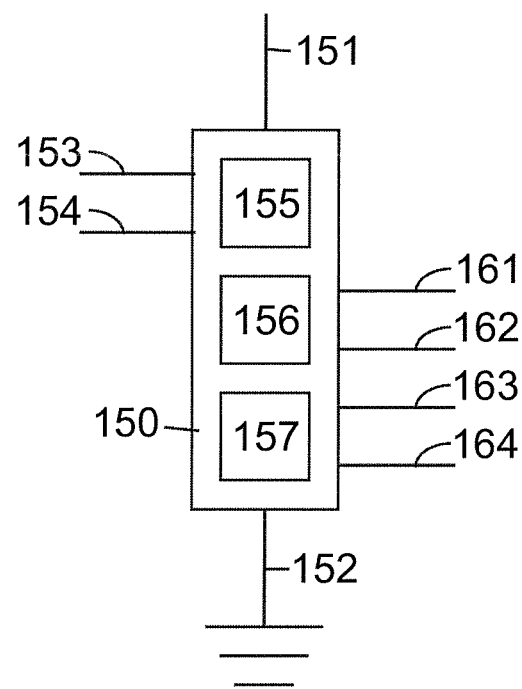
FIG. 4 illustrates the arrangement of FIG. 1 showing functions within a node.

FIG. 4 schematically depicts a node within the spatial array generally as 150. Node 150 is connected with a power source at 151 and to a ground plane at 152. Node 150 is connected to control device 10 by either by logic cable 153 or fiber optic 154. Node 150 may store the logic state received from control device 10 in memory device 155, which also functions to maintain the state of switch array 156 and amplifier 157 in accordance with the stored logic state. Node 150 is connected with conductive segments 161, 162, 163 and 164. Switch array 156 connects conductive segment 161 with conductive segment 162 in a first logic state. In a second logic state switch array 156 connects conductive segment 161 with amplifier 157, amplifies the electric power from conductive segment 161 by a factor specified by logic input 153 or 154 and stored in memory 155, and connects the amplified electric power with conductive segment 162. In a third logic state, switch array 156 connects conductive segment 161 with power input 151. In a fourth logic state, switch array 156 connects conductive segment 161 with ground 152. Node 150 may have logic states corresponding to every permutation of connections between conductive segments, conductive segments and power input 151, conductive segments and ground 152, and conductive segment pairs with amplifier 157. Note that amplifier may operate in either direction, for example to amplify power from conductive segment 163 to 164 or to amplify power from conductive segment 164 to 163.

Figure 5:
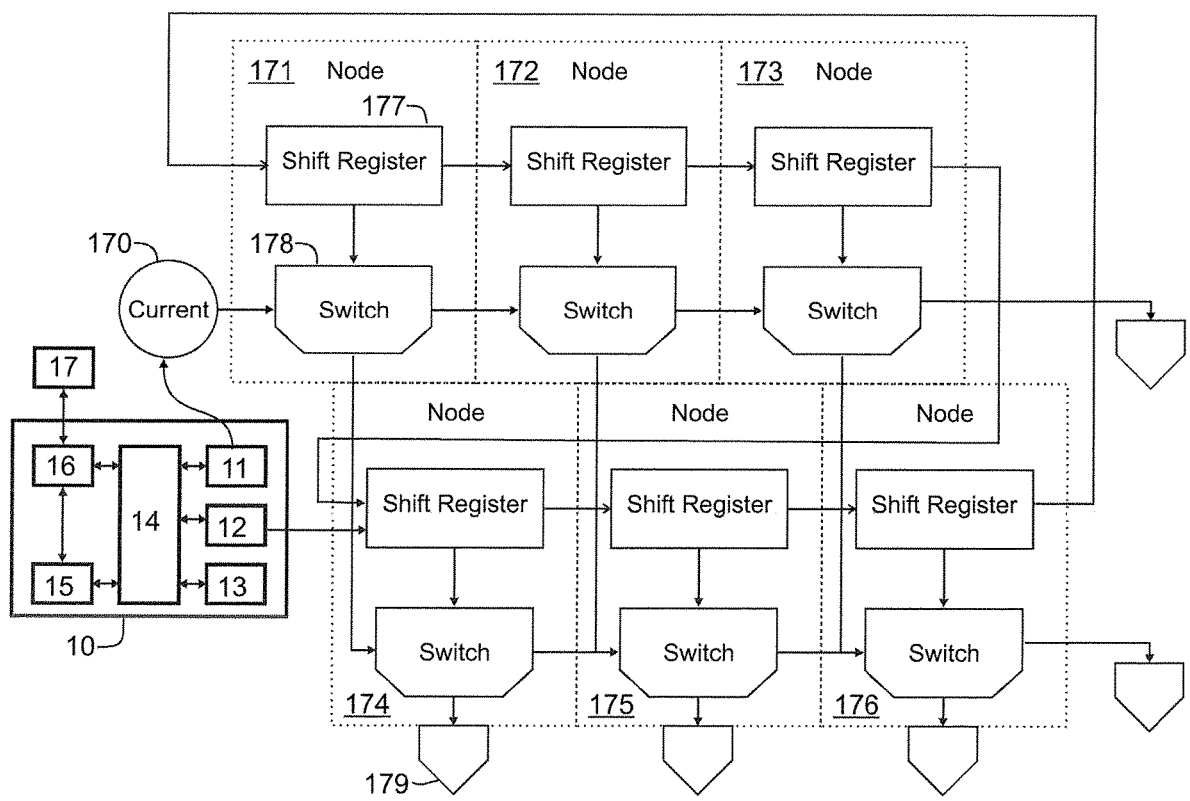
FIG. 5 illustrates logic control of node switches for the arrangement of FIG. 1.

FIG. 5 shows the flow of current and logic within a block of six nodes indicated at 171, 172, 173, 174, 175 and 176. The shift registers 177 in the nodes are connected in a loop 171→172→173→174→175→176→171 in communication with logic output 12 of control 10. Electric current 170 flows from analog output 11 of control 10 to node 171 containing switch 178 and shift register 177. In each node shift register 177 is logically connected to switch 178 and determines the binary switch state. Each node has one current input and two current outputs which may be two other nodes, one node and a termination 179 or two terminations.

Figure 6:
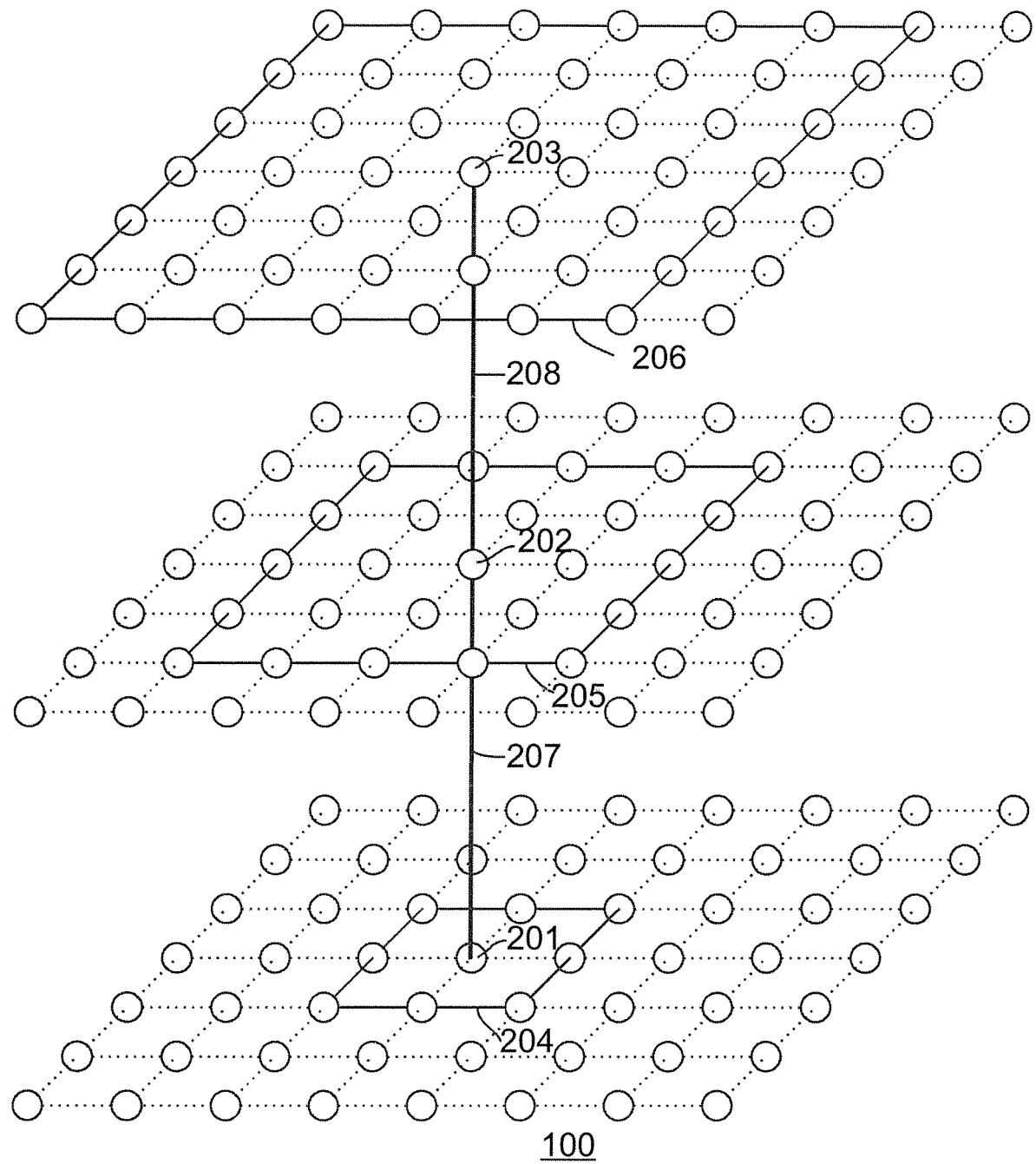
FIG. 6 illustrates sequences of conductive segments connected to form a first embodiment of directional antenna.

FIG. 6 shows a region of spatial array 100 configured as a horn antenna. In transmit mode a time varying electrical signal is supplied to node 201 by analog output 11 of control device 10 and said time varying signal is propagated to nodes 202 and 203 along conductive segments 207 and 208. Conductive segments 207 and 208 form the antenna section. In receive mode a time varying incident electromagnetic waveform is incident on conductive segments 207 and 208 and induces a time varying electric power in conductive segments 207 and 208 that is relayed to input 13 of control device 10 by node 201. A 2×2 ring of conductive segments is connected in the plane of node 201 as indicated at 204. Similarly a 4×4 ring of conductive segments is connected in the plane of node 202 as indicated at 205. Similarly a 6×6 ring of conductive segments is connected in the plane of node 203 as indicated at 206. The conductive rings 204, 205 and 206 may be connected by conductive segments between nodes of each ring (not shown) to form a three dimensional conductive mesh in the shape of a horn. The conductive mesh horn functions as a mirror to focus electromagnetic waves from or to the active antenna sections 207 and 208. The optical axis and focal length of the mesh horn can be changed dynamically by changing the sequence of connected nodes. These features may be used for example to electronically steer an antenna to a target location using a single signal. In contrast a phased array antenna requires multiple signals for multiple antennae. The dynamic antenna forming feature of the present invention may be used in combination with a phased array antenna to further enhance performance.

Figure 7:
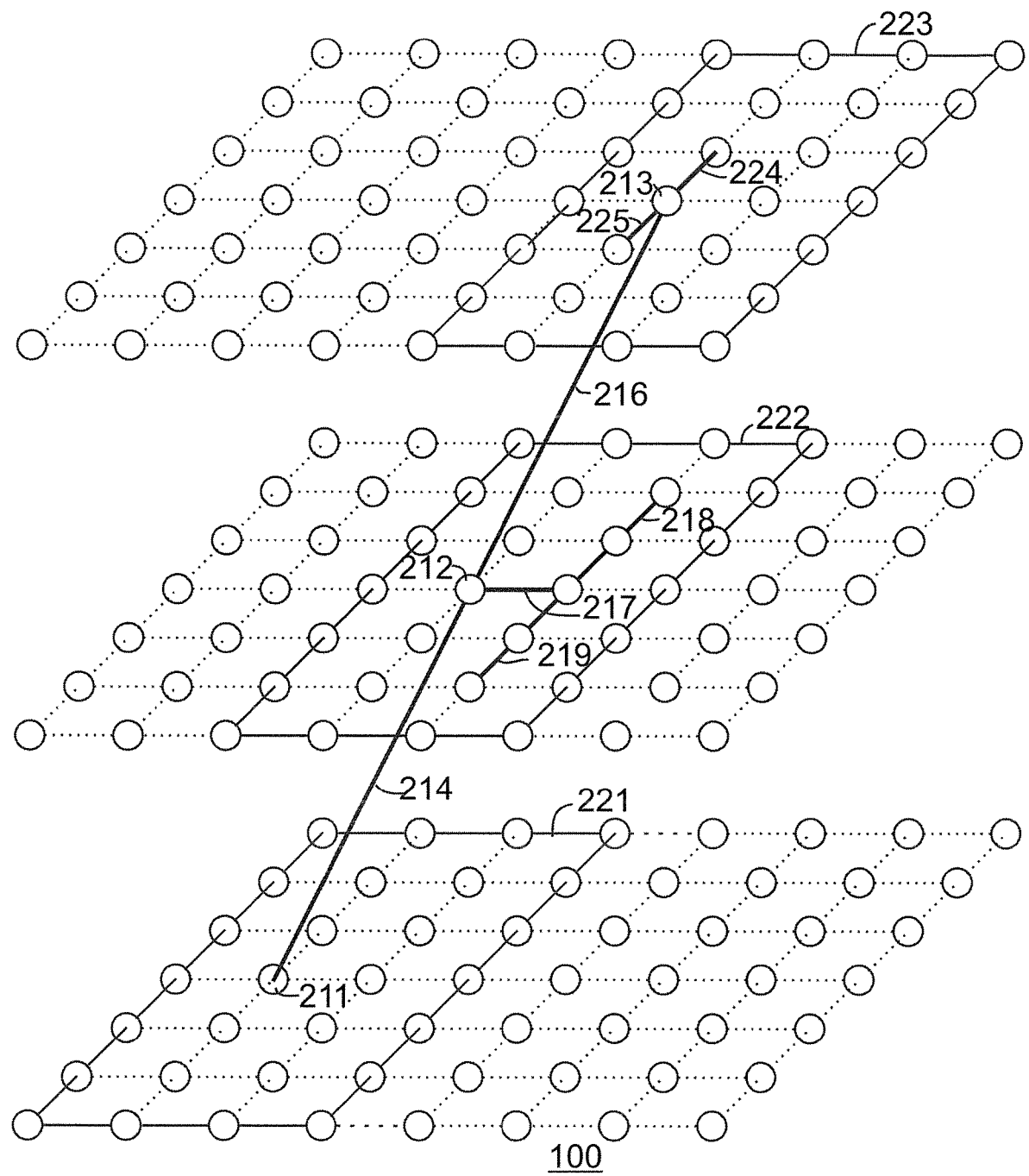
FIG. 7 illustrates sequences of conductive segments connected to form a second embodiment of directional antenna.

In FIG. 7 the spatial array of FIG. 6 is configured to form a different antenna arrangement. In the arrangement of FIG. 6, a signal to be transmitted is relayed to node 211 joined with node 212 by conductive segment 214. Node 211 is surrounded on a first plane by a conductive ring of segments as indicated at 221. At node 212, the conductive path 214 splits into two branches indicated at 216 and 217. Conductive path 217 further splits into conductive paths 218 and 219. Node 212 is surrounded by a conductive ring of segments in a second plane as indicated at 222. Conductive segment 216 connects with node 213. At node 213 the conductive path branches into two paths as indicated at 224 and 225. Node 213 is surrounded by a conductive ring of segments in a third plane as indicated at 223. Conductive rings 221, 222, and 223 may be joined by conductive segments between nodes in each ring to form a reflective mesh generally in the shape of a rectangular tube. The rectangular tube is angled with respect to the spatial array axes due to an offset between conductive rings 222, 223, and 224. The direction of the reflective tube may be changed electronically by changing the sequences of connected conductive segments. The frequency response of the active antenna may be changed electronically by changing the sequence of connected conductive segments. Preferably the lengths of individual conductive segments are less than the wavelength of the electromagnetic radiation to be transmitted or received and the lengths of conductive paths formed by connecting a plurality of conductive segments is similar to the wavelength of electromagnetic radiation to be transmitted or received.

Figure 8:
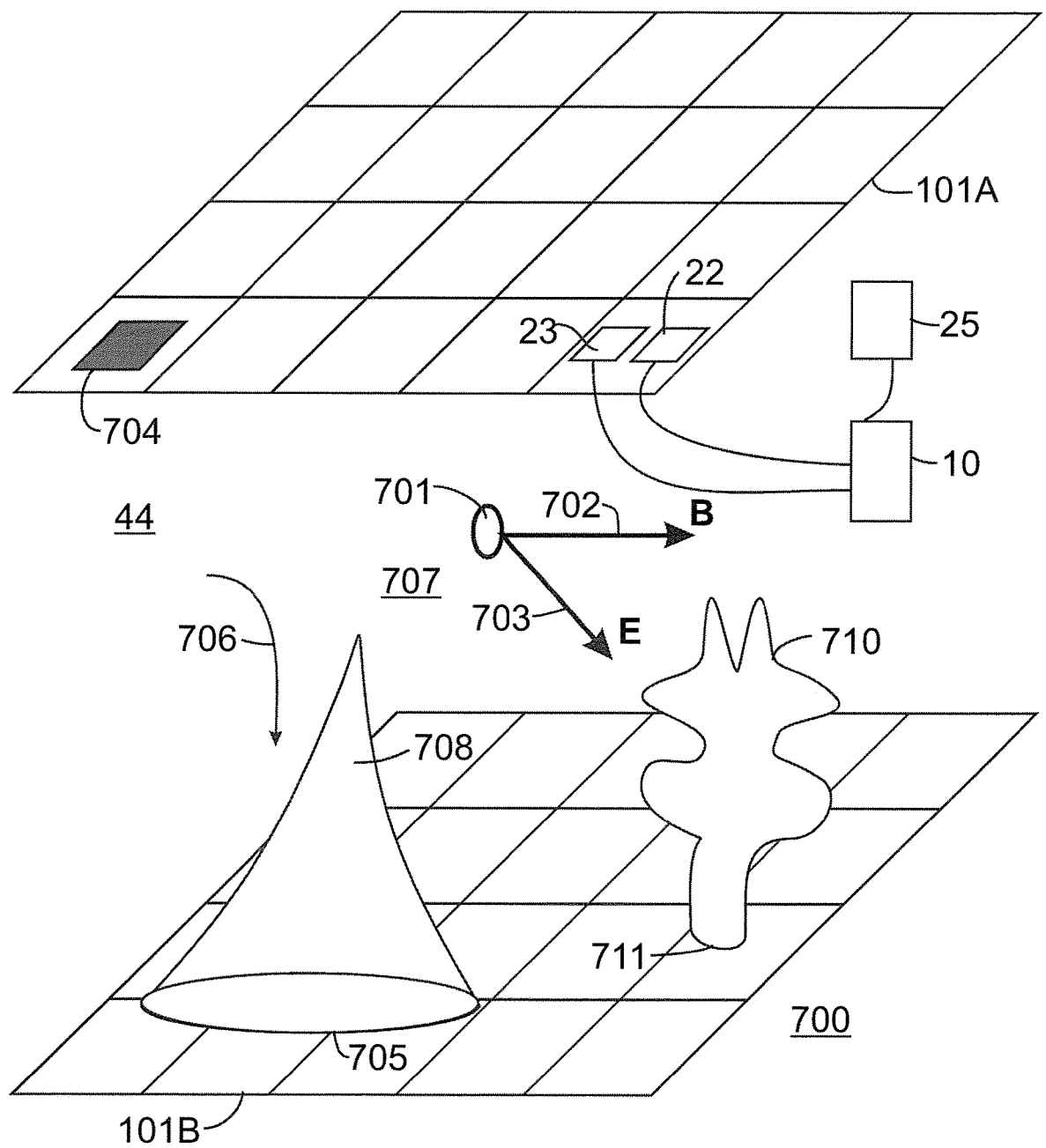
FIG. 8 illustrates a further embodiment where the arrangement of FIG. 1 is adapted for electroplating and electroforming.

FIG. 8 illustrates an electroforming operation using the spatial array apparatus of FIG. 1 generally indicated at 700 with channel 44 containing conductive liquid 707. The channel 44 is surrounded by a spatial array of conductive segments as indicated at 101A and 101B which generate a magnetic field 702 and electric field 703 at each volume element 701 of the conductive liquid 707. The electromagnetic fields are varied temporally and spatially by control 10 to produce magneto hydrodynamic forces on each volume element causing volume elements 701 to follow paths as indicated at 706 that transport charged material between substrate 704 and substrate 705. As shown 705 is a cathode and 704 is an anode. Material is added to substrate 705 (electroplating) in layers to compose shape 708 by temporally varying path 706. Alternately, material is added to mandrel 710 (electroforming) connected to spatial array of conductive segments 101B at 711. The ionic concentration in volume elements proximate to mandrel 710 is regulated by the electromagnetic field generated by spatial arrays 101A and 101B under the control of control device 10. Control device 10 receives information about the spatial distribution of material added from optical sensor 25, compares the actual spatial distribution of material with a desired spatial distribution, and modifies the electric and magnetic fields so as to reduce the difference between actual and desired spatial distributions of added material. The addition of material at 708 or 710 alters the electromagnetic field at volume element 701. The magnetic field is monitored by sensor 23 and the electric field is monitored by sensor 22, both in communication with control 10. Control 10 uses information from sensors 22 and 23 to compose a desired electromagnetic field at volume element 701. The polarity of 704 and 705 may be reversed in which case material is subtracted (electro etching) from shape 708. The polarity of 704 and 711 may be reversed (electro etching) in which case material is removed from that previously added to the mandrel. Material may be added and removed interactively with monitoring by optical sensor 25 until a desired final shape is produced.

Figure 9:
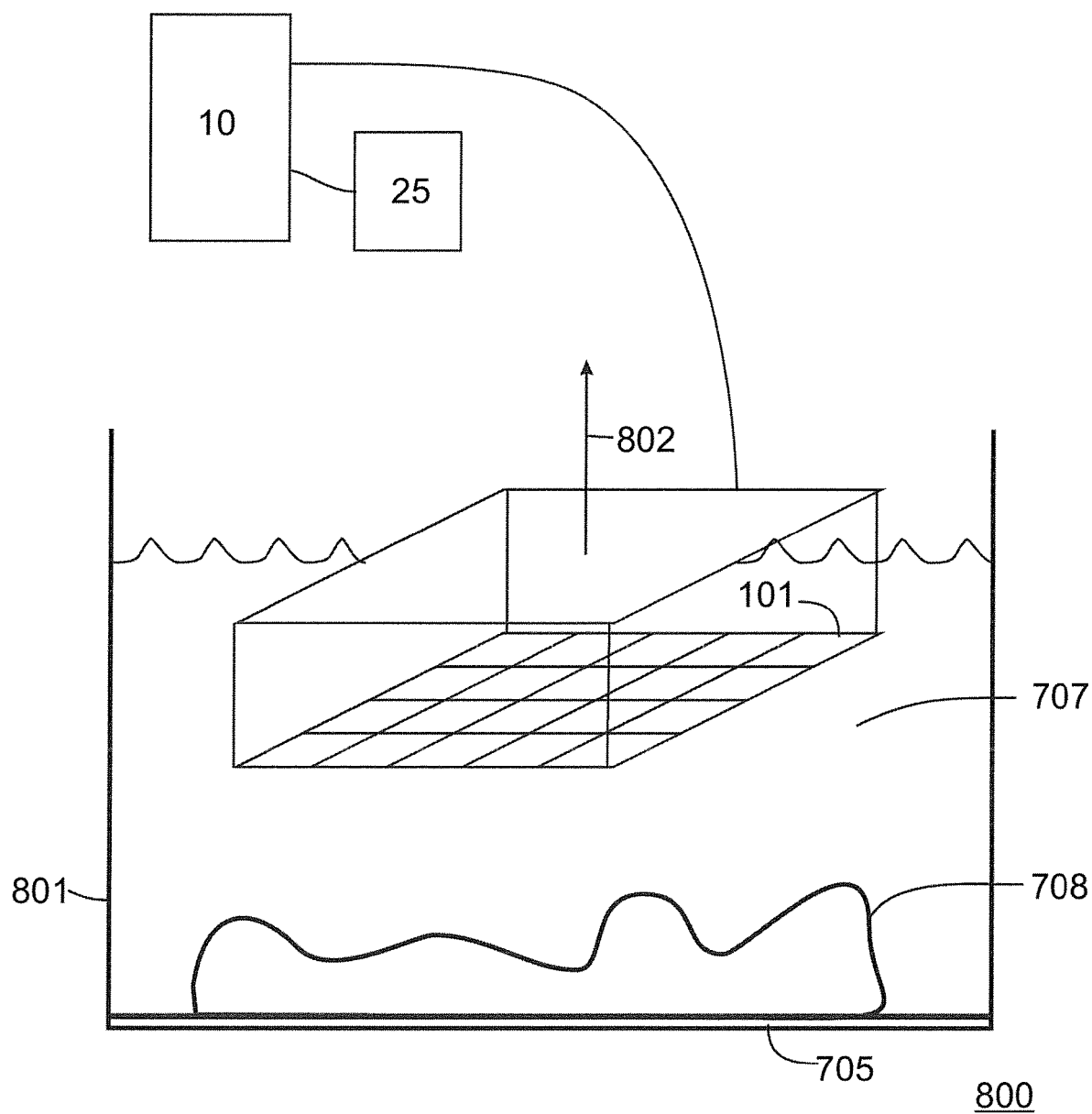
FIG. 9 illustrates a further embodiment where the arrangement of FIG. 1 is adapted functioning as a 3D printer.

FIG. 9 shows a 3D printing apparatus 800 based on the spatial array of conductive segments. A container 801 of conductive liquid 707 has cathode substrate base 705 and spatial array of conductive segments 101 suspended proximate to substrate 705. Control 10 spatially and temporally modulates the electromagnetic field proximate to substrate 705 to add (or remove) material from shape 708. Optical detector 25 monitors shape 708 and provides feedback to control 10. As shown at 802, conductive segments 101 may be translated to maintain a suitable working distance between conductive segments 101 and formed shape 708.

Figure 10:
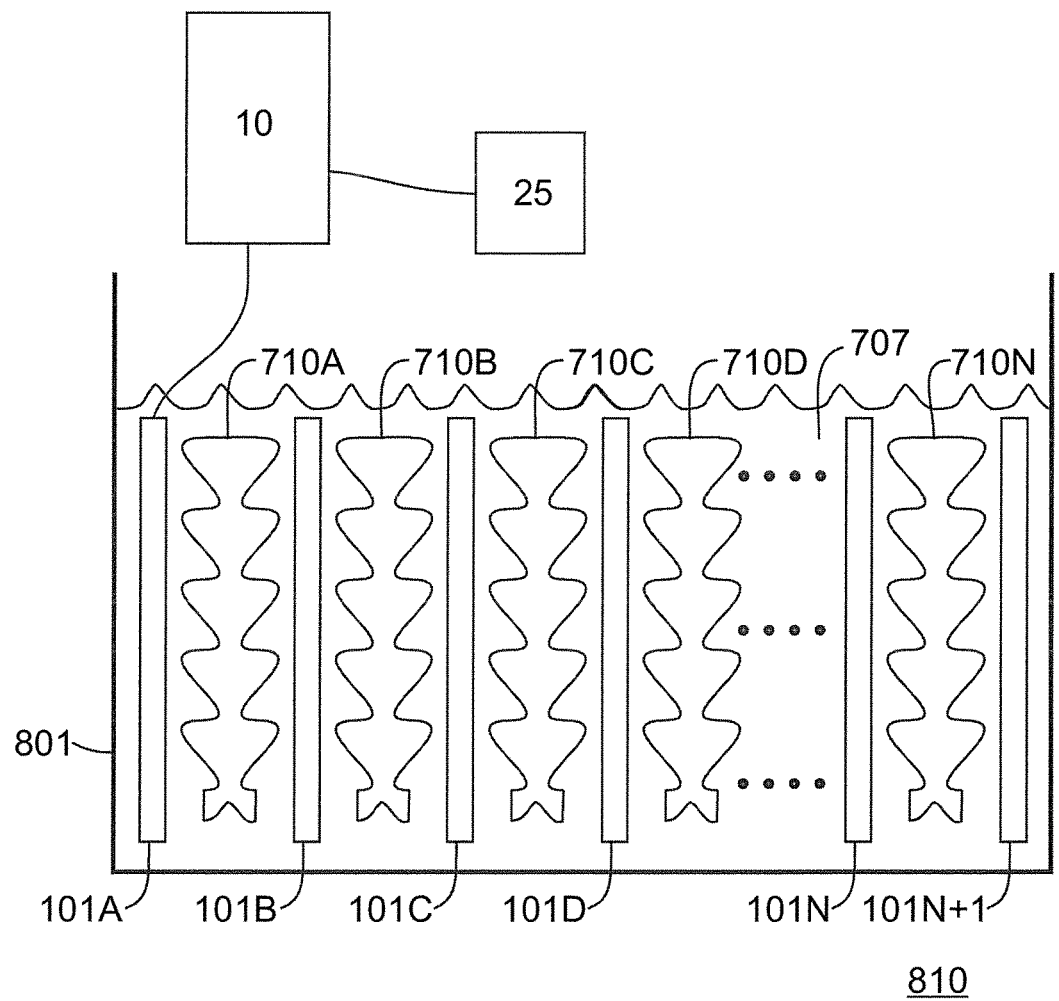
FIG. 10 illustrates a further embodiment where the arrangement of FIG. 1 is adapted for electroforming a plurality of parts in parallel.

FIG. 10 shows an arrangement for electroforming a plurality of parts in parallel indicated generally at 810. By electroforming parts in parallel, the cost per part can be reduced. A plurality of mandrels 710A, 710B, 710C, 710D and 710N are layered alternately with a plurality of spatial arrays 101A, 101B, 101C, 101D, 101N and 101N+1 in container 801. As shown the mandrels are arranged in a linear array, but in general the mandrels may be arranged in a two-dimensional or a three-dimensional array. Container 801 holds a volume of conductive fluid 707 that immerses the plurality of mandrels and plurality of spatial arrays. Each spatial array may include all of the features indicated in FIG. 1 including control 10 linked with detector 25. Detector 25 is operable to measure the spatial distribution of material added (or removed) from the mandrels. Control generates logic signals to each spatial array 101A . . . 101N+1 specifying the electromagnetic field generated by the spatial array proximate to neighboring mandrel surfaces. The electromagnetic field controls the flux and concentration of ions at each volume element of the conductive fluid and the electromagnetic potential at and proximate to corresponding area elements of adjacent mandrel surfaces, thereby controlling the rate of electrochemical addition (or removal) from said mandrel surface elements. The ions may for example be metal ions of Al, Cu, Cr, Ag, Cu, Au, etc. The electrochemical process at the mandrel surfaces may be spatially regulated on a scale comparable to the spatial array node to node distance. The node to node distance may be for example as small as 10 microns or as small as 1 micron.

The fine spatial resolution made possible by the method of this arrangement allows different thicknesses of material to be added (or removed) from spatially proximate locations on the mandrel enabling the sculpting of three dimensional features. The three-dimensional features may for example be optical elements integral to a closed loop of a spatial modulator as described in the above cited PCT applications PCT/CA2018/050599 and PCT/CA2019/051626 by the present inventors.

The invention claimed is:

1. A method for dynamically generating a conductive path for generating or interacting with an electromagnetic field comprising the steps of
   providing a spatial array with a plurality of conductive segments and a plurality of nodes;
   wherein at least some of the conductive segment intersect with at least two different ones of the conductive segments at a respective one of the plurality of nodes;
   wherein at least some of the nodes include a switching device operated according to a logic signal from a control device to conductively connect a selected first one of said conductive segments with a selected one of said two different conductive segments to form said sequence;
   wherein said switching device is operated on each of the selected first conductive segments to either allow or block electrical conduction from said selected first conductive segment to said selected one of said two second conductive segment in the spatial array;
   said control device operating on the switching device to select which of said conductive segments are conductively linked;
   thereby connecting a sequence of the conductive segments to form a conductive path;
   wherein at least some of the nodes include an amplifier operable to increase the electrical power on said selected one of said two second conductive segments.

2. The method according to claim 1 wherein a power is applied to said conductive path to produce an electromagnetic field and wherein the electromagnetic field depends at least in part on the spatial array of the connected sequence of the conductive segments in the conductive path.

3. The method according to claim 1 wherein an electromagnetic field is applied to said conductive path to produce an interaction with said conductive path and wherein the interaction with the electromagnetic field depends at least in part on the spatial array of the connected sequence of the conductive segments in the conductive path.

4. The method according to claim 1 wherein the spatial array further includes at least one sensor operable to measure a light amplitude, a magnetic field amplitude, an electric field amplitude or a temperature.

5. The method according to claim 1 wherein the control device operates on said at least one switching device with an optical signal.

6. The method according to claim 1 wherein the spatial array is three dimensional.

7. The method according to claim 1 wherein least one conductive path is connected to a conductive object wherein the conductive object alters the electric and or magnetic field proximate to said conductive object.

8. The method according to claim 1 wherein at least some space within the spatial array not occupied by said conductive segments is filled with a material selected from the list of an electrical insulator, a material with relative magnetic permittivity greater than one, a dielectric material, and a thermally conductive material.

9. The method according to claim 1 wherein at least a portion of the spatial array of conductive segments is functionally connected with at least one thermal regulation device wherein the thermal regulation device functions to either raise or lower the temperature of a portion of the spatial array.

10. The method according to claim 1 wherein at least one channel containing test materials passes through at least a portion the spatial array and wherein at least a part of an electromagnetic field generated by the spatial array interacts with test materials in said channel.

11. The method according to claim 10 wherein there is at least one path that transmits photons from a photon source outside of the spatial array to said test materials in said channel.

12. The method according to claim 10 wherein there is at least one path that transmits photons from said test materials in said channel to a photon detection device outside of the spatial array.

13. The method according to claim 1 wherein at least one switching device comprises a memory device that maintains a logic state of the switching device in accordance with a last logic state transmitted by the control device.

14. The method according to claim 1 wherein at least one switching device includes a unique address for said at least one switching device wherein the unique address is compared with an address received from the control device and if the addresses match the switching device changes to a state specified by control device.

15. The method according to claim 1 wherein the spatial array of the switching devices forms a periodic lattice.

16. The method according to claim 15 wherein there is a conductive path between each of the switching devices and its nearest neighbor in each lattice direction.

17. The method according to claim 1 wherein there is at least one conductive path between two different switching devices that are not nearest neighbors.

* * * * *